(12) United States Patent
Yamada et al.

(10) Patent No.: US 9,978,664 B2
(45) Date of Patent: May 22, 2018

(54) SEMICONDUCTOR MODULE

(71) Applicant: FUJI ELECTRIC CO., LTD., Kanagawa (JP)

(72) Inventors: Takafumi Yamada, Matsumoto (JP); Hiromichi Gohara, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days. days.

(21) Appl. No.: 15/473,638

(22) Filed: Mar. 30, 2017

(65) Prior Publication Data

US 2017/0207145 A1 Jul. 20, 2017

Related U.S. Application Data

(63) Continuation of application No. PCT/JP2016/053873, filed on Feb. 9, 2016.

(30) Foreign Application Priority Data

Apr. 1, 2015 (JP) .................................. 2015-075001

(51) Int. Cl.
*H01L 23/46* (2006.01)
*H01L 23/498* (2006.01)
(Continued)

(52) U.S. Cl.
CPC .......... *H01L 23/46* (2013.01); *H01L 23/3121* (2013.01); *H01L 23/49833* (2013.01);
(Continued)

(58) Field of Classification Search
CPC ............... H01L 23/46; H01L 23/49838; H01L 23/3121; H01L 23/49833; H01L 24/32
See application file for complete search history.

(56) References Cited

U.S. PATENT DOCUMENTS 5,212,625 A * 5/1993 Van Andel .......... H01L 23/3677
165/185
5,375,655 A * 12/1994 Lee .......................... F28F 3/02
165/185

(Continued)

FOREIGN PATENT DOCUMENTS

JP H10-200278 A 7/1998
JP 2007-142472 A 6/2007

(Continued)

OTHER PUBLICATIONS

International Search Report for International Patent Application No. PCT/JP2016/053873, issued by the Japan Patent Office dated Apr. 26, 2016.

(Continued)

*Primary Examiner* — William Coleman

(57) ABSTRACT

To bond a layered substrate and a cooling chamber having different linear expansion coefficients while preventing cracking and breaking, provided is a semiconductor module including a layered substrate formed by layering a circuit board, an insulating board, and a metal board; a semiconductor chip mounted on the circuit board; and a cooling chamber bonded to the metal board by solder. The cooling chamber includes a first board portion bonded to the metal board; a second board portion facing the first board portion; and a plurality of zigzag fins arranged between the first board portion and the second board portion. The plurality of zigzag fins are joined to the first board portion and the second board portion, and a flow path through which a coolant passes is formed by the first board portion, the second board portion, and the plurality of zigzag fins.

27 Claims, 10 Drawing Sheets

(51) Int. Cl.
*H01L 23/31* (2006.01)
*H01L 23/00* (2006.01)

(52) U.S. Cl.
CPC ........ *H01L 23/49838* (2013.01); *H01L 24/32* (2013.01); *H01L 2224/32225* (2013.01); *H01L 2924/1203* (2013.01); *H01L 2924/13055* (2013.01); *H01L 2924/13091* (2013.01)

(56) References Cited

U.S. PATENT DOCUMENTS

| | | | | |
|---|---|---|---|---|
| 5,625,299 | A * | 4/1997 | Uhling | G01R 1/073 324/754.07 |
| 6,765,793 | B2 * | 7/2004 | Kehret | H05K 7/1434 165/185 |
| 7,288,840 | B2 * | 10/2007 | Furman | H01L 23/473 257/719 |
| 7,839,641 | B2 * | 11/2010 | Baba | H01L 23/24 165/104.19 |
| 8,061,512 | B2 * | 11/2011 | Thomas | A45C 1/10 206/0.8 |
| 8,081,465 | B2 * | 12/2011 | Nishiura | H01L 23/3735 165/147 |
| 8,411,438 | B2 * | 4/2013 | Kubo | H01L 23/3672 165/152 |
| 9,190,344 | B2 * | 11/2015 | Mori | H01L 23/473 |
| 2007/0045801 | A1 * | 3/2007 | Sugiyama | H05K 1/0271 257/684 |
| 2010/0172091 | A1 | 7/2010 | Nishiura | |
| 2011/0284197 | A1 | 11/2011 | Sugimoto | |
| 2011/0297361 | A1 * | 12/2011 | Carbone | F28F 3/022 165/185 |
| 2012/0138946 | A1 | 6/2012 | Kikuchi et al. | |
| 2012/0241953 | A1 | 9/2012 | Yamada et al. | |
| 2015/0034367 | A1 | 2/2015 | Nagatomo et al. | |
| 2015/0076685 | A1 | 3/2015 | Abe et al. | |

FOREIGN PATENT DOCUMENTS

| | | |
|---|---|---|
| JP | 2010-245158 A | 10/2010 |
| JP | 2011-171686 A | 9/2011 |
| JP | 4893095 B2 | 3/2012 |
| JP | 2012-142465 A | 7/2012 |
| JP | 2012-191010 A | 10/2012 |
| JP | 2013-165298 A | 8/2013 |
| JP | 2013-225556 A | 10/2013 |
| JP | 2014022453 A | 2/2014 |
| JP | 2016-4805 A | 1/2016 |

OTHER PUBLICATIONS

Office Action issued for counterpart Japanese Application 2017-509350, issued by the Japan Patent Office dated Feb. 6, 2018.

* cited by examiner

SEMICONDUCTOR MODULE

The contents of the following Japanese patent applications are incorporated herein by reference:
NO: 2015-075001 filed on Apr. 1, 2015, and
NO: PCT/JP2016/053873 filed on Feb. 9, 2016.

BACKGROUND

1. Technical Field

The present invention relates to a semiconductor module.

2. Related Art

A power conversion apparatus is used in equipment utilizing a motor, e.g. a hybrid automobile or electric automobile, in order to achieve low energy consumption. Semiconductor modules including power semiconductor elements such as IGBTs (Insulated Gate Bipolar Transistors) are widely used in such power conversion apparatuses. Since heat is generated when a power semiconductor element controls current, a semiconductor module is known that includes a cooling chamber for cooling this power semiconductor element, as shown in Patent Documents 1 to 6, for example.

Patent Document 1: Japanese Patent Application Publication No. 2007-142472
Patent Document 2: Japanese Patent Application Publication No. H10-200278
Patent Document 3: Japanese Patent Application Publication No. 2013-165298
Patent Document 4: Japanese Patent Application Publication No. 2012-142465
Patent Document 5: Japanese Patent No. 5381561
Patent Document 6: Japanese Patent Application Publication No. 2011-171686

However, the cooling chamber cooling a layered substrate on which the power semiconductor element is mounted has a linear expansion coefficient that differs from that of the layered substrate by several times. When heat cycle testing is performed on such a semiconductor module, thermal stress occurs in the solder layer bonding this layered substrate and the cooling chamber, causing cracking and/or breaking.

SUMMARY

Therefore, it is an object of an aspect of the innovations herein to provide a semiconductor module, which is capable of overcoming the above drawbacks accompanying the related art. The above and other objects can be achieved by combinations described in the claims. According to a first aspect of the present invention, provided is a semiconductor module comprising a layered substrate formed by layering a circuit board, an insulating board, and a metal board; a semiconductor chip mounted on the circuit board; and a cooling chamber bonded to the metal board by solder. The cooling chamber includes a first board portion bonded to the metal board; a second board portion facing the first board portion; and a plurality of zigzag fins arranged between the first board portion and the second board portion. The plurality of zigzag fins are joined to the first board portion and the second board portion, and a flow path through which a coolant passes is formed by the first board portion, the second board portion, and the plurality of zigzag fins.

(General Disclosure)
(Item 1)

A semiconductor module may comprise a layered substrate formed by layering a circuit board, an insulating board, and a metal board.

The semiconductor module may comprise a semiconductor chip mounted on the circuit board.

The semiconductor module may comprise a cooling chamber bonded to the metal board by solder.

The cooling chamber may include a first board portion bonded to the metal board.

The cooling chamber may include a second board portion facing the first board portion.

The cooling chamber may include a plurality of zigzag fins arranged between the first board portion and the second board portion.

The plurality of zigzag fins may be joined to the first board portion and the second board portion, and A flow path through which a coolant passes may be formed by the first board portion, the second board portion, and the plurality of zigzag fins.

(Item 2)

The semiconductor module according to Claim 1, wherein a thickness of each of the plurality of zigzag fins is greater than or equal to 0.5 mm and less than or equal to 0.8 mm.

(Item 3)

A zigzag pitch of each of the plurality of zigzag fins may be greater than or equal to 2 mm and less than or equal to 4 mm.

(Item 4)

A zigzag angle of each of the plurality of zigzag fins may be greater than or equal to 20° and less than or equal to 35°.

(Item 5)

A thickness of the metal board may be greater than or equal to 0.6 mm and less than 1.0 mm.

(Item 6)

The semiconductor module may further comprise a resin portion that is formed by a hard resin and seals the semiconductor chip and the layered substrate.

A solder bonding surface of the metal board may be exposed from the resin portion.

(Item 7)

The solder bonding surface of the metal board may protrude from a bottom surface of the resin portion.

(Item 8)

A thickness of the metal board may be greater than or equal to 0.5 mm and less than 1.0 mm.

(Item 9)

The metal board may be formed by a metal layer bonded to the insulating board and a first heat spreader bonded to the metal layer.

(Item 10)

The circuit board may be formed by a circuit layer bonded to the insulating board and a second heat spreader bonded to the circuit layer.

(Item 11)

The plurality of zigzag fins may be arranged in parallel between the first board portion and the second board portion.

The flow path through which the coolant passes may be formed between the first board portion and the second board portion in a direction orthogonal to a direction in which the plurality of zigzag fins are arranged in parallel.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
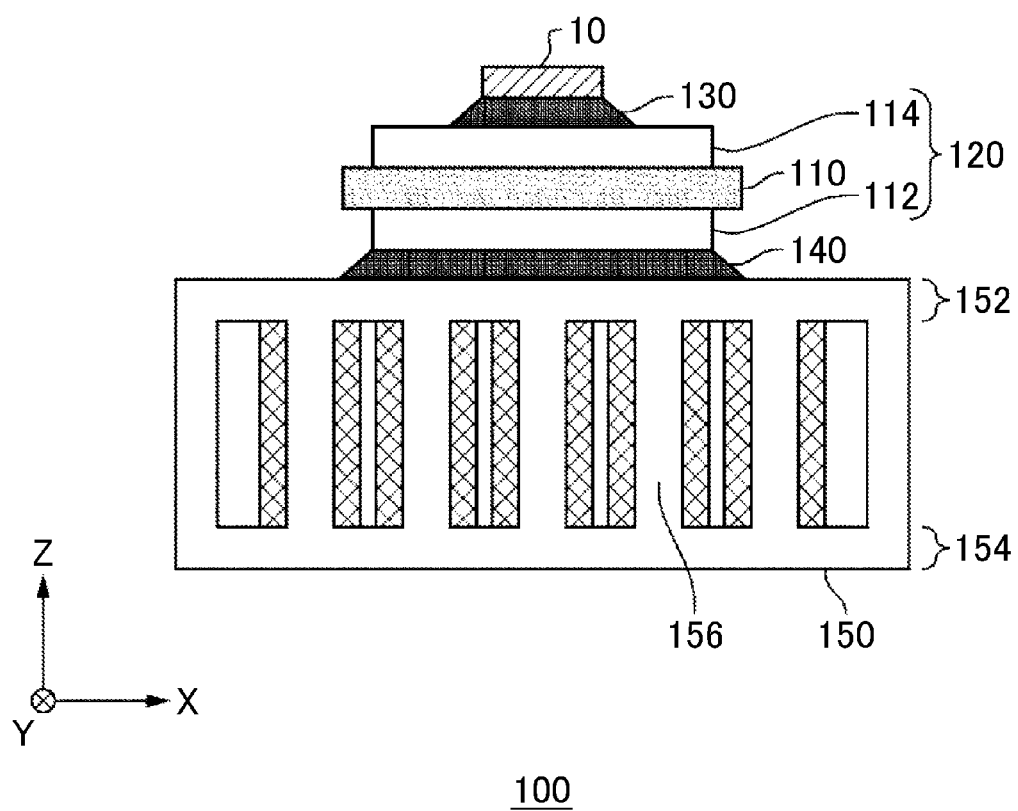
FIG. 1 shows an exemplary configuration of a semiconductor module 100 according to an embodiment of the present invention.

FIG. 1 shows an exemplary configuration of a semiconductor module 100 according to an embodiment of the present invention. In FIG. 1, a horizontal direction in the plane of the drawing is the X axis, a vertical direction in the plane of the drawing is the Z axis, and a direction perpendicular to the plane of the drawing is the Y axis. The semiconductor module 100 includes a semiconductor chip 10, a layered substrate 120, and a cooling chamber 150. The semiconductor module 100 bonds the layered substrate 120 and the cooling chamber 150, which have different linear expansion coefficients, using solder while preventing the occurrence of cracking and breaking. The semiconductor chip 10 mounted on this layered substrate 120 is cooled by the cooling chamber 150.

The semiconductor chip 10 is a cooling target that is cooled by the semiconductor module 100. The semiconductor chip 10 may be a power semiconductor element, such as an insulated gate bipolar transistor (IGBT), a power MOSFET (Metal Oxide Semiconductor Field Effect Transistor), or an FWD (Free Wheeling Diode), for example. The semiconductor chip 10 may be a combination of the above components, and may be a reverse-blocking IGBT, a reverse-conducting IGBT, or the like having a combination of the above components as a single semiconductor element.

The layered substrate 120 is configured by layering a circuit board 114, an insulating board 110, and a metal board 112. The cooling chamber 150 is provided on the metal board 112 side of the layered substrate 120, and the semiconductor chip 10 is mounted on the circuit board 114 side of the layered substrate 120. FIG. 1 shows an example in which the cooling chamber 150 is mounted on the −Z-direction side and the semiconductor chip 10 is mounted on the +Z-direction side of the layered substrate 120.

The insulating board 110 has a function of electrically insulating the semiconductor chip 10 mounted thereon from the outside, and is formed of a material including at least one of $Si_3N_4$, AlN, and $Al_2O_3$. The insulating board 110 is a ceramic substrate, for example.

The metal board 112 is arranged on one surface of the insulating board 110. The metal board 112 is arranged on the insulating board 110 with a predetermined thickness. The metal board 112 is bonded to the insulating board 110 using direct bonding, for example. The metal board 112 is bonded to the insulating board 110 and other components and the like, using solder or the like.

The circuit board 114 is arranged on the other surface of the insulating board 110. FIG. 1 shows an example in which one surface of the circuit board 114 oriented in the −Z direction is arranged in contact with the surface of the insulating board 110 oriented in the +Z direction. The circuit board 114 is formed by circuit wiring, power supply wiring, input/output wiring, and the like, and is electrically connected to the outside of the semiconductor module 100 and the semiconductor chip 10. The circuit board 114 is electrically connected to the semiconductor chip 10 via a solder layer 130, for example. In addition to this, the circuit board 114 may be electrically connected to the semiconductor chip 10 via pin wiring, wire wiring, and/or lead frame wiring, for example.

The layered substrate 120 can use a DCB (Direct Copper Bonding) substrate, an AMB (Active Metal Brazing) substrate, or the like.

The solder layer 130 bonds and secures the semiconductor chip 10 and the circuit board 114. FIG. 1 shows an example in which the solder layer 130 bonds the other surface of the circuit board 114 oriented in the +Z direction and the one surface of the semiconductor chip 10 oriented in the −Z direction. The solder layer 130 electrically connects the power supply wiring and/or ground wiring of the semiconductor chip 10 and the power supply wiring and/or ground wiring of the circuit board 114 to each other.

The solder layer 140 bonds the metal board 112 of the layered substrate 120 and the cooling chamber 150 on the surface of the layered substrate 120 opposite the surface on which the semiconductor chip 10 is mounted.

The solder layer 130 also thermally connects the semiconductor chip 10 and the layered substrate 120. In other words, the temperature of the semiconductor chip 10 is transferred to the layered substrate 120 via the solder layer 130. Furthermore, the solder layer 140 thermally connects the layered substrate 120 and the cooling chamber 150. Accordingly, the semiconductor module 100 can cool the semiconductor chip 10 by using the cooling chamber 150 to cool the layered substrate 120. The solder layer 130 and the solder layer 140 include solder material that is Sn—Ag type, Sn—Sb type, or Sn—Sb—Ag type, for example.

The cooling chamber 150 is bonded to the metal board 112 of the layered substrate 120 by the soldering of the solder layer 140. The cooling chamber 150 includes a flow path therein and cools the layered substrate 120 to which the cooling chamber 150 is thermally connected by and passing a liquid or gaseous coolant through the flow path, for example. The cooling chamber 150 is preferably formed by material with high thermal conductivity, and includes materials such as aluminum, aluminum alloys, copper, and copper alloys, for example.

Here, the linear expansion coefficient of ceramic is approximately $3\times10^{-6}/°$ C. to $8\times10^{-6}/°$ C., while the linear expansion coefficient of aluminum is approximately $23\times10^{-6}$, the linear expansion coefficient of solder is approximately $20\times10^{-6}/°$ C. to $25\times10^{-6}/°$ C., and the linear expansion coefficient of copper is approximately $17\times10^{-6}/°$ C. In this way, the materials desired as the solder and the cooling chamber 150 have thermal expansion coefficient values that are approximately several times larger than that of the material of the insulating board 110 of the layered substrate 120 secured by soldering. Accordingly, when heat cycle testing or the like is performed on a conventional semiconductor module, thermal stress corresponding to the difference between the linear expansion coefficients occurs, and cracking and/or breaking occurs in the solder layers. In particular, thermal stress is added to the solder layer of the bonding portion due to flexing (i.e. twisting of the cooling chamber) in a direction (i.e. the ±Z direction) perpendicular to the surface of the cooling chamber to which the layered substrate is bonded, and this results in the occurrence of cracks or the like in this solder layer.

Therefore, the cooling chamber 150 according to the present embodiment reduces the occurrence of cracks or the like even though there is a difference with respect to the thermal expansion coefficient of the insulating board 110, by reducing the flexing component in the ±Z direction. The cooling chamber 150 includes a first board portion 152, a second board portion 154, and a plurality of zigzag fins 156.

The first board portion 152 has the metal board 112 of the layered substrate 120 soldered onto one surface thereof. Specifically, the metal board 112 is soldered to the surface of the first board portion 152 facing the layered substrate 120 in the +Z direction, by the solder layer 140. The second board portion 154 faces the other surface of the first board portion 152. FIG. 1 shows an example in which the first board portion 152 and the second board portion 154 are each arranged substantially parallel to the XY plane.

A plurality of the zigzag fins 156 are arranged between the first board portion 152 and the second board portion 154. The plurality of zigzag fins 156 are each joined to the first board portion 152 and the second board portion 154. The flow path through which the coolant passes is configured by the first board portion 152, the second board portion 154, and the plurality of zigzag fins 156. The plurality of zigzag fins 156 each form a zigzag shape when seen from the ±Z direction, for example.

The plurality of zigzag fins 156 are formed by press machining, bending machining, casting, or the like, for example. The cooling chamber 150 can be formed by bonding the plurality of zigzag fins 156 to the first board portion 152 and the second board portion 154 that are shaped as boards, using brazing or the like.

Alternatively, a plurality of zigzag fins 156 formed integrally with the second board portion 154 may be formed by a cutting process. After this, the integrally formed second board portion 154 and plurality of zigzag fins 156 may be bonded to the first board shaped portion 152 using brazing or the like to form the cooling chamber 150.

The plurality of zigzag fins 156 are arranged substantially in parallel between the first board portion 152 and the second board portion 154, for example. Two adjacent zigzag fins 156 among the plurality of zigzag fins 156 may be arranged at predetermined intervals, and the plurality of zigzag fins 156 are arranged at substantially uniform intervals, for example. The plurality of zigzag fins 156 are described using FIG. 2.

Figure 2:
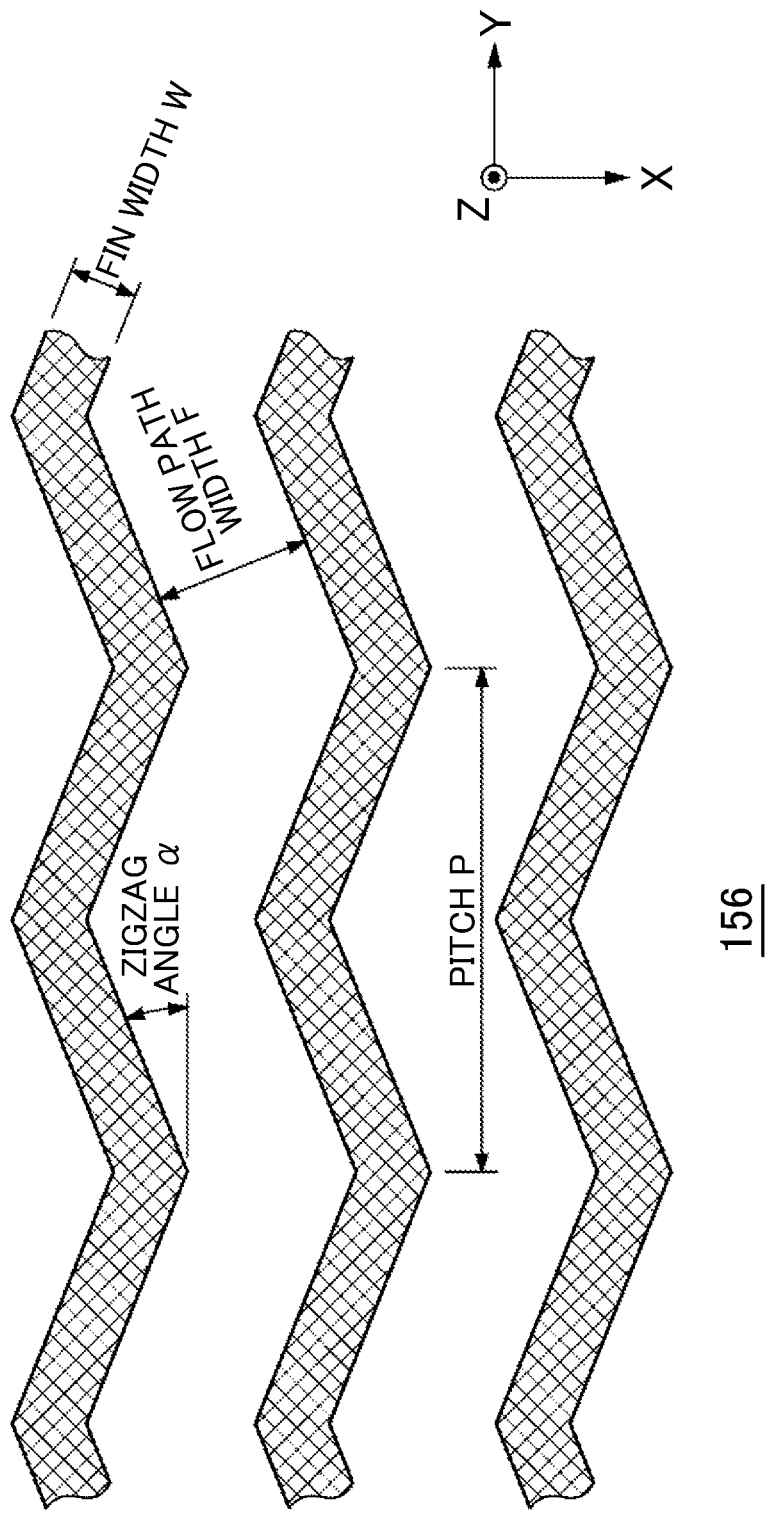
FIG. 2 shows an example of the plurality of zigzag fins 156 according to the present embodiment.

FIG. 2 shows an example of the plurality of zigzag fins 156 according to the present embodiment. FIG. 2 shows an exemplary cross section of the plurality of zigzag fins 156 substantially parallel to the XY plane. FIG. 2 shows an example in which the plurality of zigzag fins 156 are arranged at uniform intervals and in parallel in the X direction. In this way, the flow path through which the coolant flows is formed in the Y direction.

The semiconductor module 100 according to the present embodiment described above cools the layered substrate 120 by passing the coolant through the flow path formed by the first board portion 152, the second board portion 154, and the plurality of zigzag fins 156 of the cooling chamber 150. In this way, since the cooling chamber 150 uses the plurality of zigzag fins 156, it is possible to improve the heat releasing efficiency. Furthermore, the plurality of zigzag fins 156 are secured by being joined not only to the first board portion 152 but also to the second board portion 154, and therefore, even when the surrounding temperature fluctuates and thermal expansion or the like occurs, it is possible to reduce the occurrence of flexing, i.e. warping, in the ±Z direction of the first board portion 152. Accordingly, the occurrence of splitting, chipping, cracking, and breaking of the solder layer 140 can be prevented.

In the manner described above, the semiconductor module 100 according to the present embodiment can reduce the occurrence of cracking caused by heat cycles during operation and improve the reliability.

The reliability of such a semiconductor module 100 can be further improved by suitably setting parameters of the zigzag fins 156, e.g. the fin thickness W, the zigzag pitch P, and the zigzag angle α shown in FIG. 2. As an example, improving the low cycle fatigue lifetime of the solder is one example of an element improving the reliability of the solder layer 140. Generally, the low cycle fatigue lifetime of solder is believed to obey the Manson-Coffin Law as shown in the expression below.

$$\Delta\epsilon_p N_f^b = C \qquad \text{Expression 1}$$

Here, $\Delta\epsilon_p$ is the plastic strain amplitude, $N_f$ is the fatigue lifetime, and b and C are constants determined according to the material. Accordingly, it is understood that it is only necessary to reduce the plastic strain amplitude of the solder in order to extend the fatigue lifetime of the solder.

Therefore, in the semiconductor module 100 according to the present embodiment, a thermal stress simulation was used to calculate the plastic strain amplitude occurring in the solder layer 140 in a case where a heat cycle from −40° C. to 125° C. is added.

In the simulation described in the present embodiment, the insulating board 110 was an $Si_3N_4$ substrate with a thickness of 0.32 mm, the circuit board 114 and the metal board 112 were made of copper with a thickness of 0.4 mm, and the solder layer 140 was made of Sn—Sb—Ag-type solder with a thickness of 0.25 mm. Furthermore, the cooling chamber 150 was formed by an aluminum alloy (A6063), and the first board portion 152 and the second board portion 154 had a thickness of 1 mm. The height of each zigzag fin 156 in the z direction, i.e. the space between the first board portion 152 and the second board portion 154, was 8 mm and the width F of the flow path was 0.9 mm.

Figure 3:
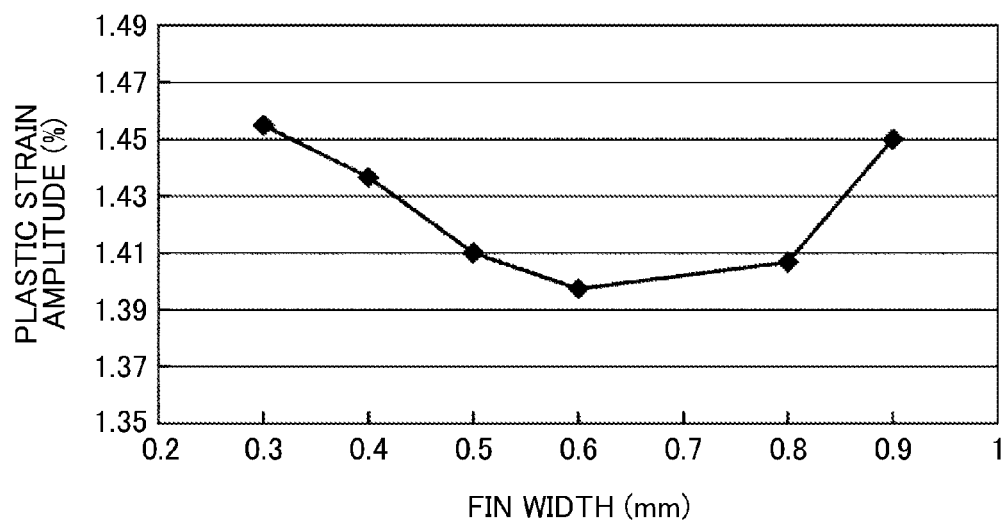
FIG. 3 shows exemplary results obtained by calculating the relationship of the plastic strain amplitude of the solder layer 140 relative to the fin width W of the zigzag fins 156 according to the present embodiment.

FIG. 3 shows exemplary results obtained by calculating the relationship of the plastic strain amplitude of the solder layer 140 relative to the fin width W of the zigzag fins 156 according to the present embodiment. When the fin width W is less than 0.5 mm, it is easy for the cooling chamber 150 to twist since the total volume of the zigzag fins 156 is small, and so the plastic strain amplitude becomes large. Furthermore, when the fin width is larger than 0.8 mm, the total volume of the zigzag fins 156 is large, and therefore this is equivalent to increasing the thickness of the first board portion 152. In other words, the expansion and contraction force caused by the heat of the first board portion 152 increases, and the plastic strain amplitude becomes large.

Accordingly, the fin thickness W of each of the plurality of zigzag fins 156 is preferably greater than or equal to 0.5 mm and less than or equal to 0.8 mm. Furthermore, the thickness of each of the plurality of zigzag fins 156 is more preferably greater than or equal to 0.6 mm and less than or equal to 0.7 mm.

Figure 4:
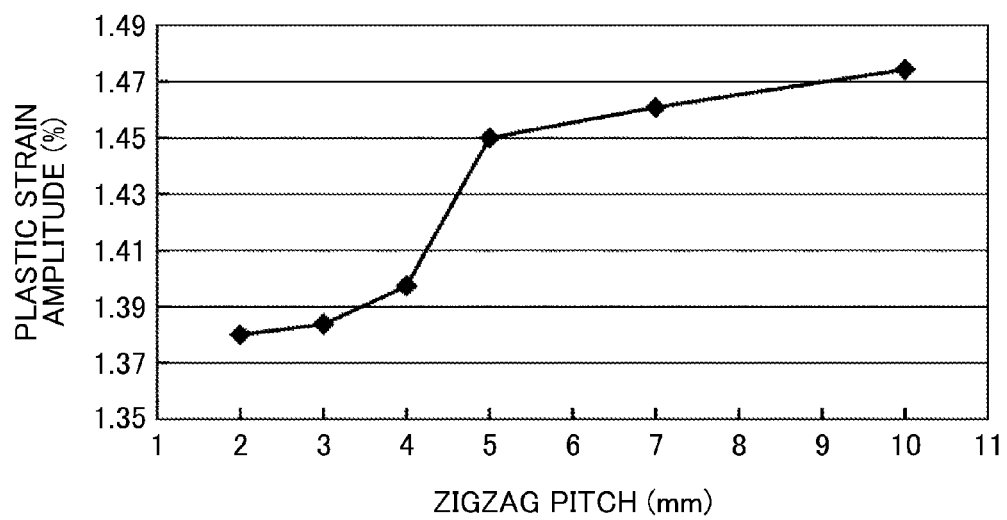
FIG. 4 shows exemplary results obtained by calculating the relationship of the plastic strain amplitude of the solder layer 140 relative to the zigzag pitch P of the zigzag fins 156 according to the present embodiment.

FIG. 4 shows exemplary results obtained by calculating the relationship of the plastic strain amplitude of the solder layer 140 relative to the zigzag pitch P of the zigzag fins 156 according to the present embodiment. When the zigzag pitch P is in a range of less than or equal to 4 mm, the plastic strain amplitude of the solder is small. On the other hand, when the zigzag pitch P is greater than 4 mm, the depths of the peaks and valleys in the zigzag pattern become greater and the rigidity of the cooling chamber in the X direction increases, and therefore the plastic strain amplitude becomes large. Accordingly, the zigzag pitch for each of the plurality of zigzag fins 156 is preferably less than or equal to 4 mm. Furthermore, in a case where the zigzag pitch P is formed to be less than 2 mm, it is sometimes difficult to ensure the semi-machining accuracy. Therefore, the zigzag pitch of the plurality of zigzag fins 156 is preferably greater than or equal to 2 mm and less than or equal to 4 mm.

Figure 5:
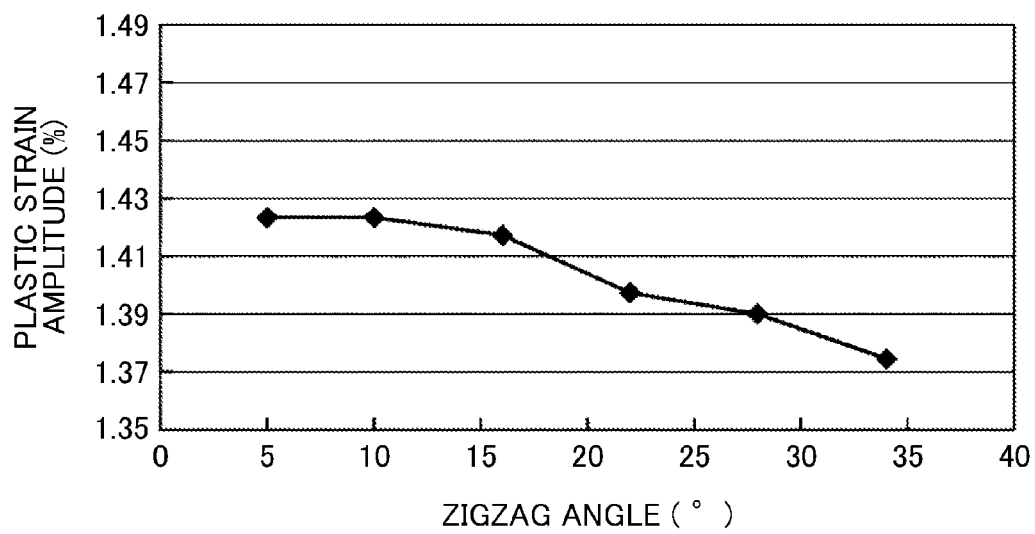
FIG. 5 shows exemplary results obtained by calculating the relationship of the plastic strain amplitude of the solder layer 140 relative to the zigzag angle α of the zigzag fins 156 according to the present embodiment.

FIG. 5 shows exemplary results obtained by calculating the relationship of the plastic strain amplitude of the solder layer 140 relative to the zigzag angle α of the zigzag fins 156 according to the present embodiment. When the zigzag angle α is in a range of greater than or equal to 20°, the plastic strain amplitude is small. In other words, when the zigzag angle α is less than 20°, the fins have a nearly straight shape without a zigzag pattern and the total volume of the cooling chamber 150 is small, thereby causing the cooling chamber 150 to easily twist, and so the plastic strain amplitude is large. Accordingly, the zigzag angle of the plurality of zigzag fins 156 is preferably greater than or equal to 20°. Furthermore, when the zigzag angle of the plurality of zigzag fins 156 is greater than 35°, the flow path resistance is large, and therefore the cooling efficiency of the cooling chamber 150 drops. Therefore, the zigzag angle of the plurality of zigzag fins 156 is more preferably greater than or equal to 20° and less than or equal to 35°.

In the semiconductor module 100 according to the present embodiment described above, a case is described in which the simulation was performed using copper with a thickness of 0.4 mm as the metal board 112. Here, the metal board 112 is directly bonded to the insulating board 110, and therefore it is also possible to control the effect of the expansion and contraction caused by the heat of the insulating board 110 on the solder layer 140, by changing the thickness of the metal board 112. In particular, it is possible to reduce the effect of the insulating board 110 on the solder layer 140 by increasing the thickness of the metal board 112. Specifically, the thickness of the metal board 112 is preferably greater than or equal to 0.6 mm.

However, when the thickness of the metal board 112 is greater than or equal to 1.0 mm, cracking occurs in the insulating board 110 as a result of the soldering process being repeated. Furthermore, there are cases where the circuit board 114 peels away from the insulating board 110 or the metal board 112 peels away from the insulating board 110. Specifically, the thickness of the metal board 112 is preferably greater than or equal to 0.6 mm and less than 1.0 mm.

In the manner described above, the semiconductor module 100 according to the present embodiment can reduce the thermal stress added to the solder layer 140 and reduce the occurrence of cracking and the like, by suitably setting the parameters of the zigzag fins 156 and the thickness of the metal board 112. In order to improve the reliability of such a semiconductor module 100, a technique of sealing the entire module with resin is known. However, when the entire module is sealed, the volume of the resin increases and cracking occurs in the resin. Therefore, a semiconductor module 100 that prevents the occurrence of such cracking in the resin is described below.

Figure 6:
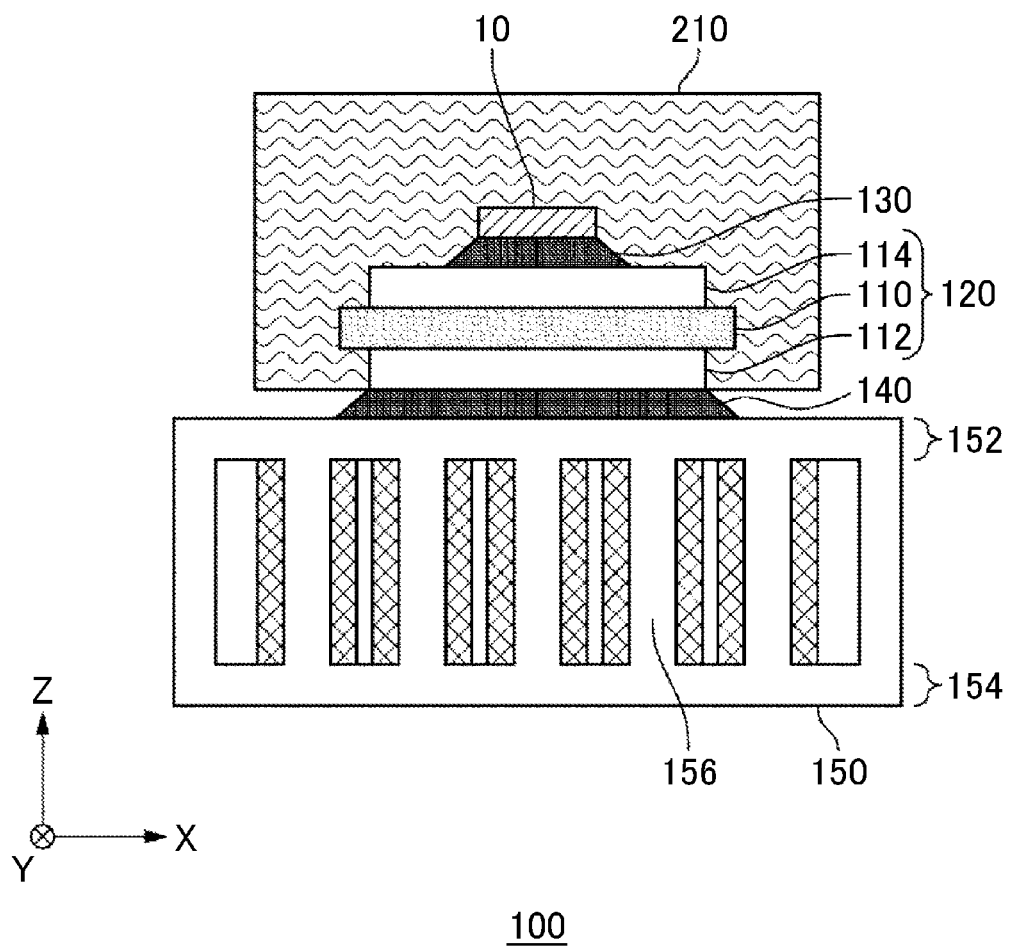
FIG. 6 shows a first modification of the semiconductor module 100 according to the present embodiment.

FIG. 6 shows a first modification of the semiconductor module 100 according to the present embodiment. In the semiconductor module 100 of the first modification, components having substantially the same operation as in the semiconductor module 100 according to the embodiment shown in FIG. 1 are given the same reference numerals, and descriptions thereof are omitted. The semiconductor module 100 according to the first modification further includes a resin portion 210.

The resin portion 210 is a hard resin with insulating properties, for example. The resin portion 210 is an epoxy resin, for example. The resin portion 210 covers the semiconductor chip 10, the solder layer 130, and the layered substrate 120, thereby sealing these components. Furthermore, the resin portion 210 leaves the solder bonding surface of the metal board 112 exposed. By sealing with the resin portion 210, it is possible to improve the reliability of the semiconductor module 100.

The same simulation as described in FIGS. 3 to 5 was performed for this semiconductor module 100. In this simulation, the insulating board 110 was an $Si_3N_4$ substrate with a thickness of 0.32 mm, the circuit board 114 was made of copper with a thickness of 0.4 mm, and the solder layer 140 was made of Sn—Sb—Ag-type solder with a thickness of 0.25 mm. Furthermore, the cooling chamber 150 was formed by an aluminum alloy (A6063), and the first board portion 152 and the second board portion 154 had a thickness of 1 mm. The height of each zigzag fin 156 in the z direction, i.e. the space between the first board portion 152 and the second board portion 154, was 8 mm, the width F of the flow path was 0.9 mm, and the fin width was 0.8 mm. The plastic strain amplitude was calculated using the thickness of the metal board 112 as the parameter.

Figure 7:
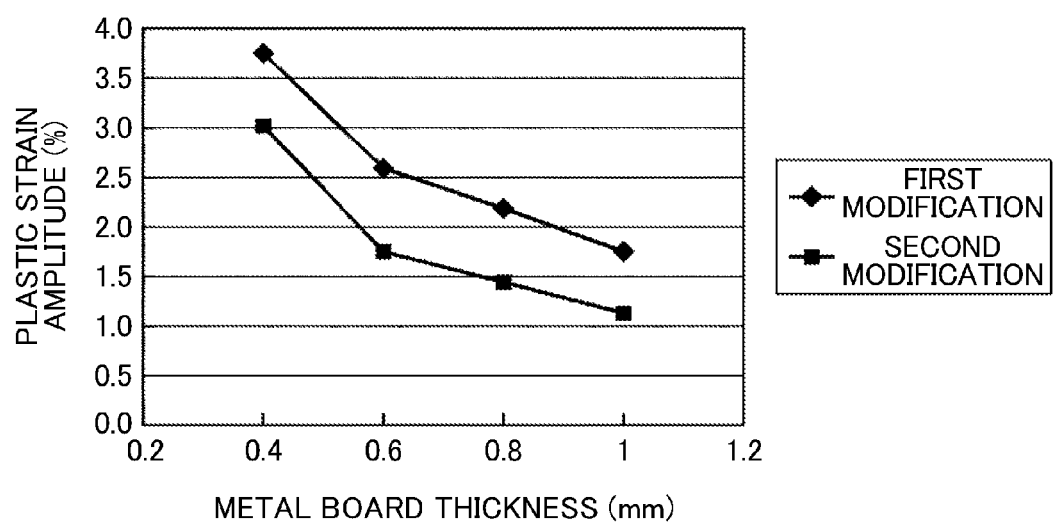
FIG. 7 shows exemplary results obtained by calculating the relationship of the plastic strain amplitude of the solder layer 140 relative to the thickness of the metal board 112 according to the present embodiment.

FIG. 7 shows exemplary results obtained by calculating the relationship of the plastic strain amplitude of the solder layer 140 relative to the thickness of the metal board 112 according to the present embodiment. It is understood that the plastic strain amplitude can be reduced by increasing the thickness of the metal board 112. In particular, the effect of reducing the plastic strain amplitude is large when the thickness of the metal board 112 is greater than or equal to 0.6 mm. In other words, the thickness of the metal board 112 is preferably greater than or equal to 0.6 mm.

From the simulation results shown in FIG. 7, it is predicted that it is possible to reduce the plastic strain amplitude even when the thickness of the metal board 112 is greater than or equal to 1.0 mm. However, as described above, when the thickness of the metal board 112 is greater than or equal to 1.0 mm, there are cases where defects occur due to the repetition of the soldering process. Therefore, the thickness of the metal board 112 is preferably greater than or equal to 0.6 mm and less than 1.0 mm.

Figure 8:
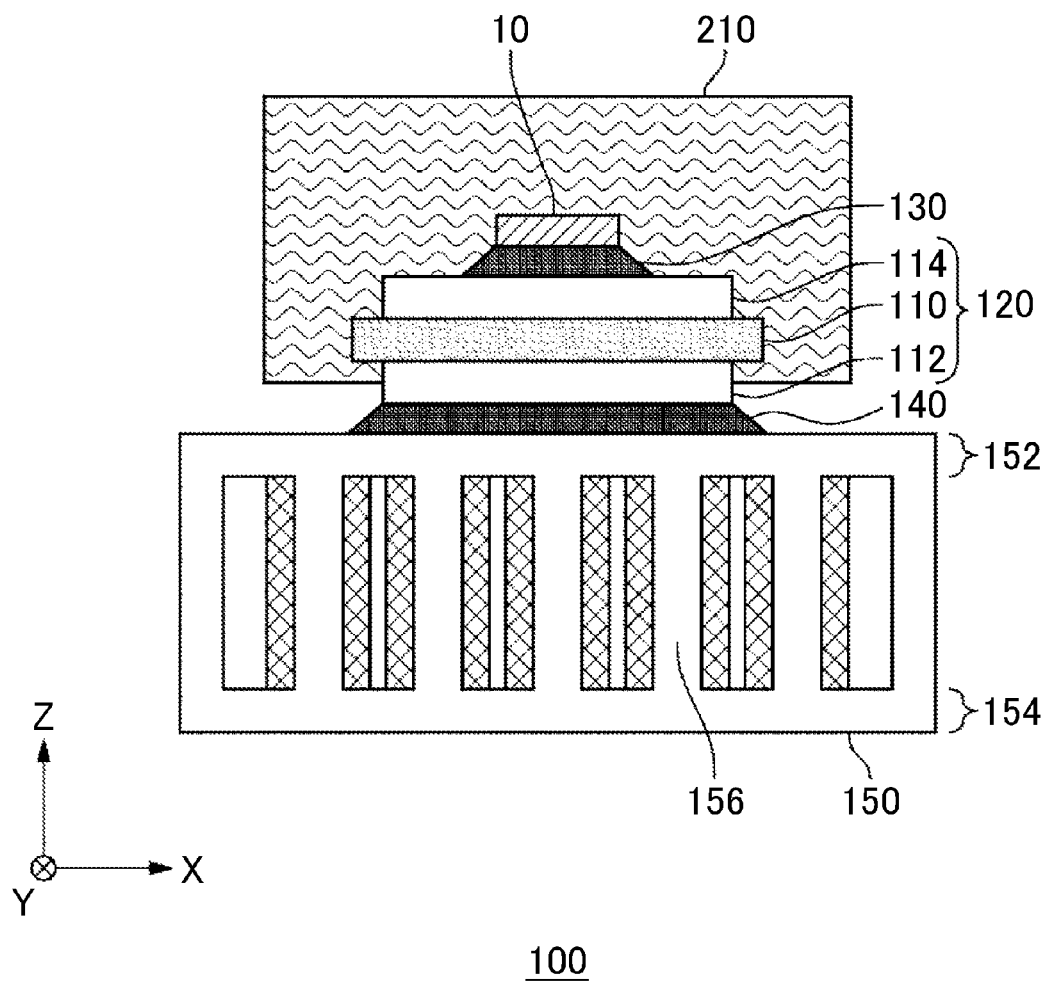
FIG. 8 shows a second modification of the semiconductor module 100 according to the present embodiment.

FIG. 8 shows a second modification of the semiconductor module 100 according to the present embodiment. In the semiconductor module 100 of the second modification, components having substantially the same function as in the semiconductor module 100 according to the first modification shown in FIG. 6 are given the same reference numerals, and descriptions thereof are omitted.

In the semiconductor module 100 of the second modification, the solder bonding surface of the metal board 112 protrudes from the resin portion 210. Specifically, a space is provided between the resin portion 210 and the solder layer 140. In other words, the metal board 112 is interposed between the resin portion 210 and the solder layer 140, and prevents the resin portion 210 from contacting the solder layer 140. In this way, it is possible to prevent the expansion and contraction of the resin portion 210 from being directly transferred to the solder layer 140 when a heat cycle is added. In this way, when sealing the semiconductor module 100 with the resin portion 210, by providing the space between the resin portion 210 and the solder layer 140, it is possible to reduce the thermal stress added to the solder layer 140 when a heat cycle is applied. Therefore, the reliability of the semiconductor module 100 can be further improved.

The simulation results for the semiconductor module 100 of the second modification are shown by black rectangles in FIG. 7. These simulation results are obtained in a case where the protruding thickness of the metal board 112 is half of the thickness of the metal board 112 and the other parameters are substantially the same as the parameters used in the simulation for the semiconductor module 100 according to the first modification. From FIG. 7, it is understood that the semiconductor module 100 of the second modification can reduce the plastic strain amplitude when compared to the semiconductor module 100 of the first modification. In particular, the effect of reducing the plastic strain amplitude is large when the thickness of the metal board 112 is greater than or equal to 0.5 mm. In other words, the thickness of the metal board 112 is preferably greater than or equal to 0.5 mm. Furthermore, as described above, when the thickness of the metal board 112 is greater than or equal to 1.0 mm, there are cases where defects occur due to the repetition of the soldering process. Therefore, the thickness of the metal board 112 in the second modification is preferably greater than or equal to 0.5 mm and less than 1.0 mm.

Figure 9:
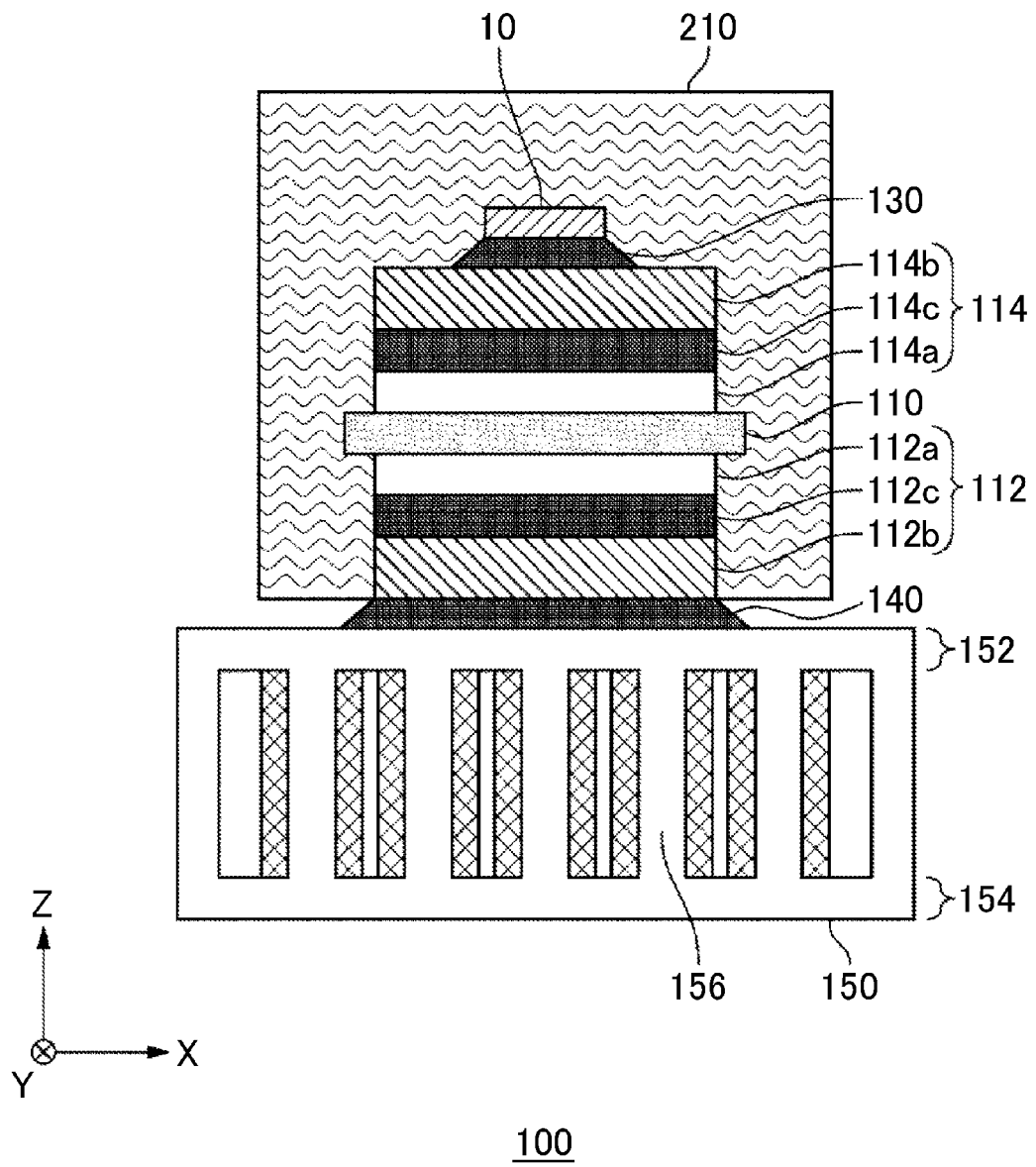
FIG. 9 shows a third modification of the semiconductor module 100 according to the present embodiment.

FIG. 9 shows a third modification of the semiconductor module 100 according to the present embodiment. In the semiconductor module 100 of the third modification, components having substantially the same function as in the semiconductor module 100 according to the first modification shown in FIG. 6 are given the same reference numerals, and descriptions thereof are omitted. In the semiconductor module 100 according to the third modification, the metal board 112 is formed by a metal layer 112a, a first heat spreader 112b, and a solder layer 112c that bonds these components together. Furthermore, the circuit board 114 is formed by a circuit layer 114a, a second heat spreader 114b, and a solder layer 114c that bonds these components together.

The metal layer 112a is provided to be bonded to one surface of the insulating board 110. The first heat spreader 112b is provided between the metal layer 112a and the cooling chamber 150. Furthermore, the first heat spreader 112b is bonded to the metal layer 112a by the solder layer 112c. The cooling chamber 150 is soldered to the first heat spreader 112b by the solder layer 140. The solder layer 112c includes substantially the same material as the solder layer 140, for example.

The circuit layer 114a is provided to be bonded to the other surface of the insulating board 110. The second heat spreader 114b is provided between the semiconductor chip 10 and the circuit layer 114a. Furthermore, the second heat spreader 114b is bonded to the circuit layer 114a by the solder layer 114c. The semiconductor chip 10 is soldered to the second heat spreader 114b by the solder layer 130. The solder layer 114c includes substantially the same material as the solder layer 140, for example.

The first heat spreader 112b preferably has a linear expansion coefficient with a value near that of the linear expansion coefficient of the solder layer 140 and the solder layer 112c. In this way, the first heat spreader 112b can ameliorate and reduce the thermal stress added to the solder layer 140 from the insulating board 110.

The second heat spreader 114b diffuses the heat generated by the semiconductor chip 10, and reduces the thermal resistance. The second heat spreader 114b preferably has a linear expansion coefficient with a value near that of the linear expansion coefficient of the solder layer 130 and the solder layer 114c. The first heat spreader 112b and the second heat spreader 114b include copper as a material, for example. Furthermore, the second heat spreader 114b may be formed of substantially the same material as the first heat spreader 112b.

The resin portion 210 covers and seals the semiconductor chip 10, the solder layer 130, the second heat spreader 114b, the solder layer 114c, the circuit layer 114a, the insulating board 110, the metal layer 112a, the solder layer 112c, and the first heat spreader 112b. Furthermore, the resin portion 210 leaves the solder bonding surface of the first heat spreader 112b on the solder layer 140 side exposed.

A greater thickness for the first heat spreader 112b increases the total thickness of the metal board 112, and therefore increases the effect. Specifically, the total thickness of the metal layer 112a and the first heat spreader 112b is preferably greater than or equal to 0.6 mm and less than 1.0 mm.

In the semiconductor module 100 of the third modification described above, the thicknesses of the solder layer 112c and the solder layer 114c were set to 0.1 mm, and the same simulation as shown in FIG. 7 was performed. From the simulation results, it was understood that the semiconductor module 100 of the third modification can reduce the plastic strain amplitude in the same manner as the semiconductor module 100 of the first modification.

Figure 10:
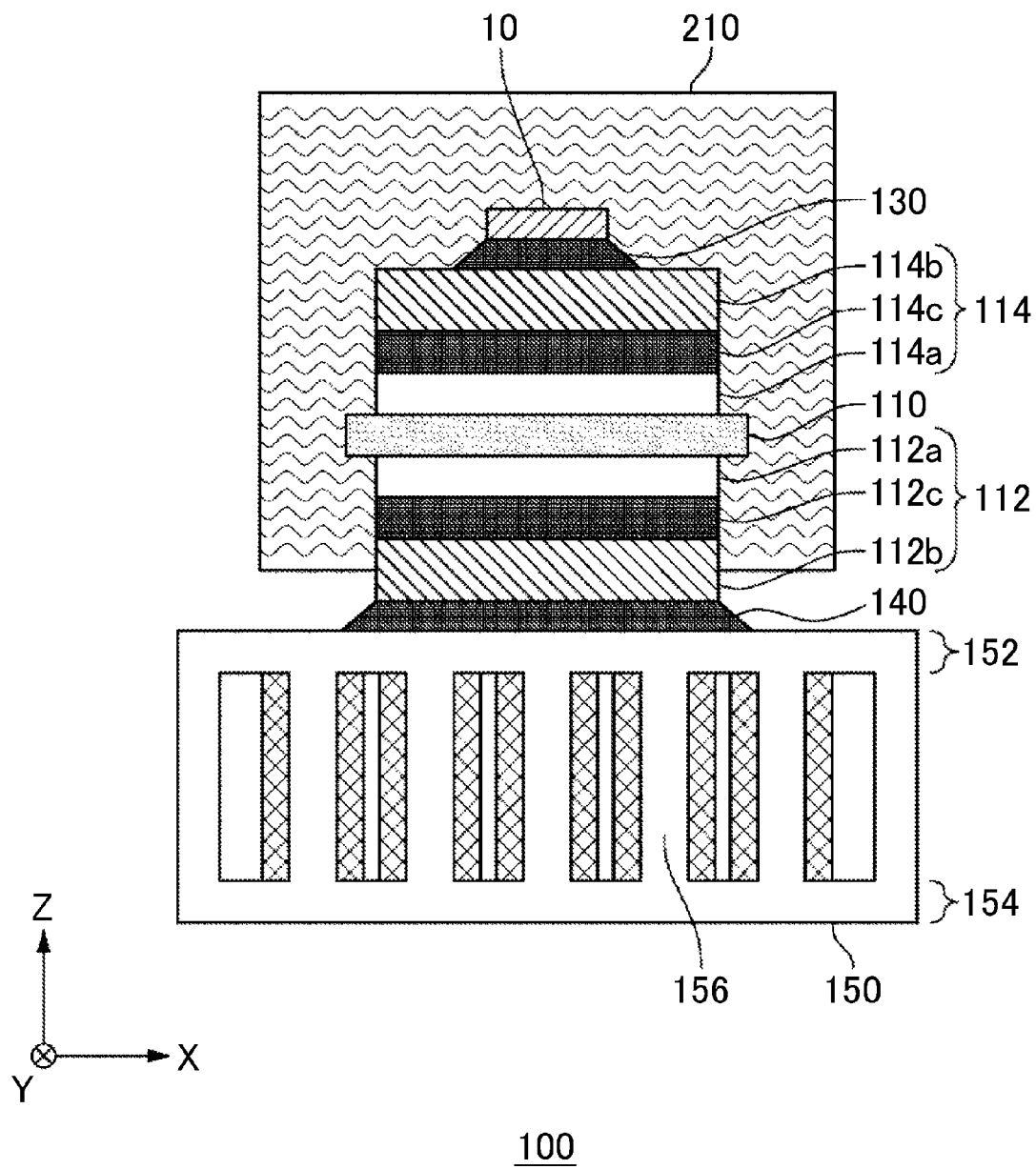
FIG. 10 shows a fourth modification of the semiconductor module 100 according to the present embodiment.

FIG. 10 shows a fourth modification of the semiconductor module 100 according to the present embodiment. In the semiconductor module 100 of the fourth modification, components having substantially the same function as in the semiconductor modules 100 according to the second modification and the third modification shown in FIGS. 8 and 9 are given the same reference numerals, and descriptions thereof are omitted. In the semiconductor module 100 according to the fourth modification, in the same manner as in the semiconductor module 100 of the third modification, the metal board 112 is formed by a metal layer 112a, a first heat spreader 112b, and a solder layer 112c that bonds these components together. Furthermore, the circuit board 114 is formed by a circuit layer 114a, a second heat spreader 114b, and a solder layer 114c that bonds these components together. Yet further, in the semiconductor module 100 of the fourth modification, in the same manner as in the semiconductor module 100 of the second modification, the first heat spreader 112b of the metal board 112 protrudes from the resin portion 210.

In this way, since the first heat spreader 112b of the metal board 112 protrudes from the surface of the resin portion 210 oriented in the −Z direction, i.e. the bottom surface, it is possible to further reduce the thermal stress added to the solder layer 140 from the resin portion 210 when a heat cycle is applied to the semiconductor module 100.

In the semiconductor module 100 of the fourth modification described above, the thicknesses of the solder layer 112c and the solder layer 114c were set to 0.1 mm, and the same simulation as shown in FIG. 7 was performed. From the simulation results, it was understood that the semiconductor module 100 of the fourth modification can reduce the plastic strain amplitude in the same manner as the semiconductor module 100 of the second modification.

In the semiconductor modules 100 of the third and fourth modification, the circuit board 114 is described as being formed by the circuit layer 114a, the second heat spreader 114b, and the solder layer 114c that bonds these components together. Here, if there is no problem with the thermal resistance between the semiconductor chip 10 and the insulating board 110, the second heat spreader 114b does not need to be included. Furthermore, the second heat spreader 114b may be provided during the manufacturing and/or design of the semiconductor module 100 in order to maintain a balance between the semiconductor chip 10 side of the insulating board 110 and the cooling chamber 150 side.

The manufacturing method of the semiconductor modules 100 of the first to fourth modifications is as described below. First, the semiconductor chip 10 is soldered, i.e. the solder layer 130 is formed, on the circuit board 114 of the layered substrate 120 that has been prepared. Next, these configurational components are sealed by the resin portion 210 such that the solder bonding surface of the metal board 112 is exposed. Finally, the prepared cooling chamber 150 and the solder bonding surface of the metal board 112 are soldered together, i.e. the solder layer 140 is formed.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor module, comprising:
   a layered substrate formed by layering a circuit board, an insulating board, and a metal board;
   a semiconductor chip mounted on the circuit board; and
   a cooling chamber bonded to the metal board by solder, wherein
   the cooling chamber includes:
      a first board portion bonded to the metal board;
      a second board portion facing the first board portion; and
      a plurality of zigzag fins arranged between the first board portion and the second board portion,
   the plurality of zigzag fins are joined to the first board portion and the second board portion,
   a flow path through which a coolant passes is formed by the first board portion, the second board portion, and the plurality of zigzag fins, and
   a thickness of each of the plurality of zigzag fins is greater than or equal to 0.5 mm and less than or equal to 0.8 mm.

2. The semiconductor module according to claim 1, further comprising:
   a resin portion that is formed by a hard resin and seals the semiconductor chip and the layered substrate, wherein
   a solder bonding surface of the metal board is exposed from the resin portion.

3. The semiconductor module according to claim 1, wherein
   the metal board is formed by a metal layer bonded to the insulating board and a first heat spreader bonded to the metal layer.

4. The semiconductor module according to claim 1, wherein
   the circuit board is formed by a circuit layer bonded to the insulating board and a second heat spreader bonded to the circuit layer.

5. The semiconductor module according to claim 1, wherein
   the plurality of zigzag fins are arranged in parallel between the first board portion and the second board portion, and
   the flow path through which the coolant passes is formed between the first board portion and the second board portion in a direction orthogonal to a direction in which the plurality of zigzag fins are arranged in parallel.

6. The semiconductor module according to claim 2, wherein
   the solder bonding surface of the metal board protrudes from a bottom surface of the resin portion.

7. The semiconductor module according to claim 6, wherein
   a thickness of the metal board is greater than or equal to 0.5 mm and less than 1.0 mm.

8. A semiconductor module, comprising:
   a layered substrate formed by layering a circuit board, an insulating board, and a metal board;
   a semiconductor chip mounted on the circuit board; and
   a cooling chamber bonded to the metal board by solder, wherein
   the cooling chamber includes:
      a first board portion bonded to the metal board;
      a second board portion facing the first board portion; and
      a plurality of zigzag fins arranged between the first board portion and the second board portion,
   the plurality of zigzag fins are joined to the first board portion and the second board portion,
   a flow path through which a coolant passes is formed by the first board portion, the second board portion, and the plurality of zigzag fins, and
   a zigzag pitch of each of the plurality of zigzag fins is greater than or equal to 2 mm and less than or equal to 4 mm.

9. The semiconductor module according to claim 8, further comprising:

a resin portion that is formed by a hard resin and seals the semiconductor chip and the layered substrate, wherein
a solder bonding surface of the metal board is exposed from the resin portion.

10. The semiconductor module according to claim 8, wherein
the metal board is formed by a metal layer bonded to the insulating board and a first heat spreader bonded to the metal layer.

11. The semiconductor module according to claim 8, wherein
the circuit board is formed by a circuit layer bonded to the insulating board and a second heat spreader bonded to the circuit layer.

12. The semiconductor module according to claim 8, wherein
the plurality of zigzag fins are arranged in parallel between the first board portion and the second board portion, and
the flow path through which the coolant passes is formed between the first board portion and the second board portion in a direction orthogonal to a direction in which the plurality of zigzag fins are arranged in parallel.

13. The semiconductor module according to claim 9, wherein
the solder bonding surface of the metal board protrudes from a bottom surface of the resin portion.

14. The semiconductor module according to claim 13, wherein
a thickness of the metal board is greater than or equal to 0.5 mm and less than 1.0 mm.

15. A semiconductor module, comprising:
a layered substrate formed by layering a circuit board, an insulating board, and a metal board;
a semiconductor chip mounted on the circuit board; and
a cooling chamber bonded to the metal board by solder, wherein
the cooling chamber includes:
a first board portion bonded to the metal board;
a second board portion facing the first board portion; and
a plurality of zigzag fins arranged between the first board portion and the second board portion,
the plurality of zigzag fins are joined to the first board portion and the second board portion,
a flow path through which a coolant passes is formed by the first board portion, the second board portion, and the plurality of zigzag fins, and
a zigzag angle of each of the plurality of zigzag fins is greater than or equal to 20° and less than or equal to 35°.

16. The semiconductor module according to claim 15, further comprising:
a resin portion that is formed by a hard resin and seals the semiconductor chip and the layered substrate, wherein
a solder bonding surface of the metal board is exposed from the resin portion.

17. The semiconductor module according to claim 15, wherein
the metal board is formed by a metal layer bonded to the insulating board and a first heat spreader bonded to the metal layer.

18. The semiconductor module according to claim 15, wherein
the circuit board is formed by a circuit layer bonded to the insulating board and a second heat spreader bonded to the circuit layer.

19. The semiconductor module according to claim 15, wherein
the plurality of zigzag fins are arranged in parallel between the first board portion and the second board portion, and
the flow path through which the coolant passes is formed between the first board portion and the second board portion in a direction orthogonal to a direction in which the plurality of zigzag fins are arranged in parallel.

20. The semiconductor module according to claim 16, wherein
the solder bonding surface of the metal board protrudes from a bottom surface of the resin portion.

21. The semiconductor module according to claim 20, wherein
a thickness of the metal board is greater than or equal to 0.5 mm and less than 1.0 mm.

22. A semiconductor module, comprising:
a layered substrate formed by layering a circuit board, an insulating board, and a metal board;
a semiconductor chip mounted on the circuit board; and
a cooling chamber bonded to the metal board by solder, wherein
the cooling chamber includes:
a first board portion bonded to the metal board;
a second board portion facing the first board portion; and
a plurality of zigzag fins arranged between the first board portion and the second board portion,
the plurality of zigzag fins are joined to the first board portion and the second board portion,
a flow path through which a coolant passes is formed by the first board portion, the second board portion, and the plurality of zigzag fins, and
a thickness of the metal board is greater than or equal to 0.6 mm and less than 1.0 mm.

23. The semiconductor module according to claim 22, further comprising:
a resin portion that is formed by a hard resin and seals the semiconductor chip and the layered substrate, wherein
a solder bonding surface of the metal board is exposed from the resin portion.

24. The semiconductor module according to claim 22, wherein
the metal board is formed by a metal layer bonded to the insulating board and a first heat spreader bonded to the metal layer.

25. The semiconductor module according to claim 22, wherein
the circuit board is formed by a circuit layer bonded to the insulating board and a second heat spreader bonded to the circuit layer.

26. The semiconductor module according to claim 22, wherein
the plurality of zigzag fins are arranged in parallel between the first board portion and the second board portion, and
the flow path through which the coolant passes is formed between the first board portion and the second board portion in a direction orthogonal to a direction in which the plurality of zigzag fins are arranged in parallel.

27. The semiconductor module according to claim 23, wherein
the solder bonding surface of the metal board protrudes from a bottom surface of the resin portion.

* * * * *